United States Patent [19]
Lavine

[11] Patent Number: 5,314,836
[45] Date of Patent: May 24, 1994

[54] METHOD OF MAKING A SINGLE ELECTRODE LEVEL CCD

[75] Inventor: James P. Lavine, Rochester, N.Y.

[73] Assignee: Eastman Kodak Company, Rochester, N.Y.

[21] Appl. No.: 945,073

[22] Filed: Sep. 15, 1992

[51] Int. Cl.$^5$ ............................................. H01L 21/339
[52] U.S. Cl. ............................................. 437/53; 437/50; 437/924; 148/DIG. 111
[58] Field of Search .................. 437/27, 28, 50, 53, 437/924; 148/DIG. 111

[56] References Cited

U.S. PATENT DOCUMENTS

| | | |
|---|---|---|
| 4,083,098 | 4/1978 | Nicholas . |
| 4,143,178 | 3/1979 | Harada et al. . |
| 4,449,287 | 5/1984 | Maas et al. . |
| 4,613,402 | 9/1986 | Losee et al. . |
| 4,652,339 | 3/1987 | Bluzer et al. ............ 437/53 |
| 4,994,405 | 2/1991 | Jayakar ............... 437/53 |

FOREIGN PATENT DOCUMENTS

| | | |
|---|---|---|
| 58-193544 | 11/1983 | Japan . |
| 63-244882 | 10/1988 | Japan . |
| 3060-158-A | 7/1989 | Japan . |
| 22643 | 1/1990 | Japan . |
| 344941 | 2/1991 | Japan . |

OTHER PUBLICATIONS

Hosack, "Minimum Geometry Etch Windows to a Polysilicon Surface", IEEE Transactions on Electron Devices, ED-25, No. 1 (Jan. 1978) pp. 67-69.

Slotboom et al., "Submicron CCD Memory Structures Fabricated By Electron-Beam Lithography" Technical Digest of IEDM (1984) pp. 308-311.

Hoople et al., "Characteristics of Submicrometer Gaps in Buried-Channel CCD Structures", IEEE Transactions on Electron Devices, vol. 38, No. 5 (May 1991) pp. 1175-1181.

Knauer, "CCD Versus BBD Mode for CCD with Ion-Implanted Gaps", IEEE Transactions on Electron Devices, ED-24 (Mar. 1977), pp. 286-288.

Kapoor, "Charge-Coupled Devices with Submicron Gaps", IEEE Electron Device Letters, EDL-2, No. 4 (Apr. 1981) pp. 92-94.

Hosack et al., "Submicron Patterning of Surfaces", IEEE Journal of Solid-State Circuits, SC-12, No. 4 (Aug. 1977) pp. 363-367.

*Primary Examiner*—George Fourson
*Attorney, Agent, or Firm*—Raymond L. Owens

[57] ABSTRACT

The disclosure is directed to a method of forming a CCD with two sets of gate electrodes in a single layer of a conductive material. The method comprises forming a channel region in a body of a semiconductor material along a surface thereof and forming a layer of conductive material over and insulated from the surface of the body. A first masking layer is formed on the conductive layer and spaced strips of polycrystalline silicon are formed on the first masking layer. Using a portion of the spaces between the strips as a mask, impurities of a conductivity type opposite that of the channel region are embedded in the channel region to form spaced barrier regions along the channel region. A layer of silicon dioxide is formed over each of the strips and the spaces between the strips are filled with polycrystalline silicon. The portion of the silicon dioxide layer at one end of each of the strips is etched away to expose a portion of the first masking layer. The exposed portions of the first masking layer are etched away to form grooves through the first masking layer to the conductive layer. The portions of the conductive layer at the bottom of the grooves are then etched away to define the conductive layer into closely spaced gate electrodes.

19 Claims, 3 Drawing Sheets

METHOD OF MAKING A SINGLE ELECTRODE LEVEL CCD

FIELD OF THE INVENTION

The present invention relates to a method of making gate electrodes for a charge coupled device (CCD), and, more particularly, to a method of making a single level gate electrode system for a CCD.

BACKGROUND OF THE INVENTION

A CCD, in general, comprises a body of a semiconductor material, such as single crystalline silicon, having a channel region in and along a surface of the body. A layer of an insulating material, typically silicon dioxide, is on the surface of the body and over the channel region. A plurality of conductive gate electrodes, typically of doped polycrystalline silicon, are on the insulating layer and extend across the channel region. The gate electrodes are positioned along the entire length of the channel region.

In a two phase CCD, the gate electrodes are arranged in two sets which alternate along the channel region. The gate electrodes of one set are connected to a first phase potential, and the gate electrodes of the other set are connected to a second phase potential. Such a two phase CCD also typically includes in the body, a barrier region under an edge of each of the gate electrodes and extending across the channel region. The barrier regions prevent the charge from moving backwards along the channel region.

The two sets of gate electrodes could be formed from a single layer of the doped polycrystalline silicon by depositing the single layer and defining it by photolithography and etching to form the spaced gate electrodes along the channel region. However, using commercial type photolithographic and etching techniques and equipment, it is difficult to form the gate electrodes having very narrow spacing therebetween with the spacing being uniform across the entire width of the gate electrodes. Since relatively wide and/or non-uniform spacings can form potential barriers between the gate electrodes, they can interfere with the transfer of charge from one gate electrode to the next. Therefore, it has been the practice to form the gate electrodes from two separate levels (layers) of polycrystalline silicon. For a two level system, a first layer of polycrystalline silicon is deposited and defined to form one set of the gate electrodes. The first set of gate electrodes is covered with a layer of an insulating material, typically silicon dioxide. A second layer of polycrystalline silicon is then deposited over the first set of gate electrodes and the spaces between the first set of gate electrodes. The second layer of polycrystalline silicon is then defined to form the second set of gate electrodes which are between the gate electrodes of the first set. Also, each of the gate electrodes of the second set overlaps the adjacent gate electrodes of the first set. Since the gate electrodes overlap each other, there are no gaps therebetween which can form undesirable potential barriers. However, the two level gate electrode system is relatively complex in structure and requires two deposition steps, two definition steps and an oxidation step. Therefore, it would be desirable to have a method of making a two phase gate electrode system from a single layer of polycrystalline silicon.

SUMMARY OF THE INVENTION

The present invention is directed to a method of making a gate electrode for a CCD from a single layer of a conductive material. The method comprises forming a layer of a conductive material over and insulated from a surface of a body of a semiconductor material of one conductivity type. A first masking layer is then formed over the conductive layer, and spaced strips of a material which can be oxidized and which can be etched with an etchant which does not effectively etch the material of the first masking layer are formed on the first masking layer. A layer of an oxide is formed over each of the strips with the oxide layer extending across the end edges of the strips so as to extend partially across the spaces between the strips. A layer of non-single crystalline silicon is then formed on the surface of the first masking layer in the remaining portions of the spaces between the strips with the surface of the non-single crystalline layer being substantially planar with the surface of the oxide layer over each of the strips. A second masking layer is formed over each of the strips with the second masking layer extending over the portion of the oxide layer at one end of the strips leaving exposed the portion of the oxide layer at the other end of the strips. The exposed portions of the oxide layers at the other ends of the strips are etched away to expose a portion of the first masking layer thereunder. The exposed portions of the first masking layer are etched down to the conductive layer to form spaced grooves in the first masking layer which expose portions of the surface of the conductive layer. Using the grooves as a guide the conductive layer is divided into spaced gate electrodes.

The invention will be better understood from the following more detailed description and claims taken with the accompanying drawings.

The drawings are not necessarily to scale.

DETAILED DESCRIPTION

Figure 1:
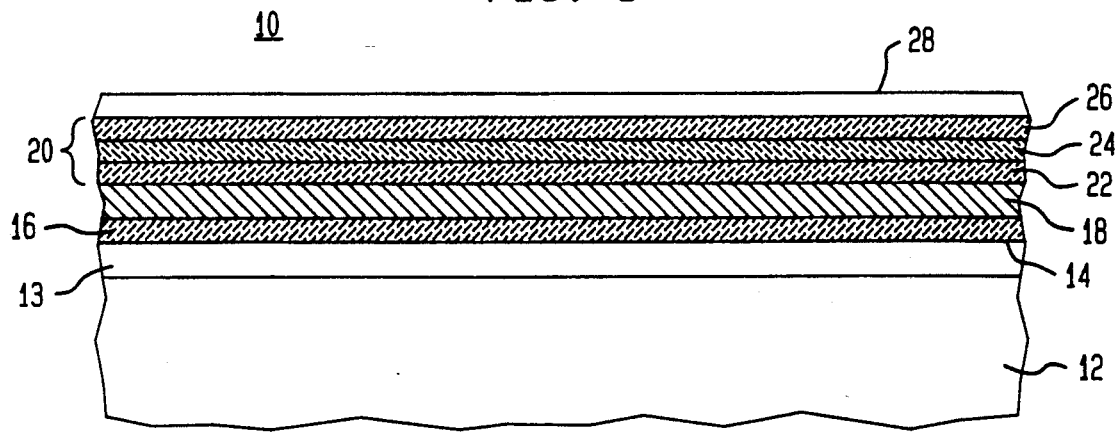
FIGS. 1-8 are each sectional views of a CCD in various stages of being made in accordance with a method of the present invention.

Referring now to FIG. 1, there is shown a sectional view of a two-phase CCD 10 in an initial stage of fabrication in accordance with a method of the present invention. CCD 10 comprises a substrate body 12 of a semiconductor material of one conductivity type, such as p-type conductivity single crystalline silicon. The body 12 is provided with a region 13 therein of the opposite conductivity type, such as n-type conductivity, which extends to and along a surface 14 thereof. The region 13 forms the buried channel of the CCD 10. The region 13 may be formed by ion implanting an n-type conductivity dopant into the body 12 through the surface 14. On the surface 14 of the body 12 is a layer 16 of an insulating material, typically silicon dioxide. On the insulating layer 16 is a layer 18 of a conductive material, typically doped polycrystalline silicon, from which the gate electrodes of the CCD 10 are to be formed. On the conductive layer 18 is a first masking layer 20. As shown, the first masking layer 20 is a trilayer comprising a first layer 22 of silicon nitride ($Si_3N_4$) on the conductive layer 18, a second layer 24 of silicon dioxide ($SiO_2$), and a third layer 26 of silicon nitride ($Si_3N_4$). On the third layer 26 of the first masking layer 20 is a second masking layer 28. The second masking layer is of a material which can be oxidized and which can be etched by an etchant which does not effectively etch the material of the third layer 26 of the first masking layer 20, such as polycrystalline or amorphous silicon, or a metal.

Figure 2:
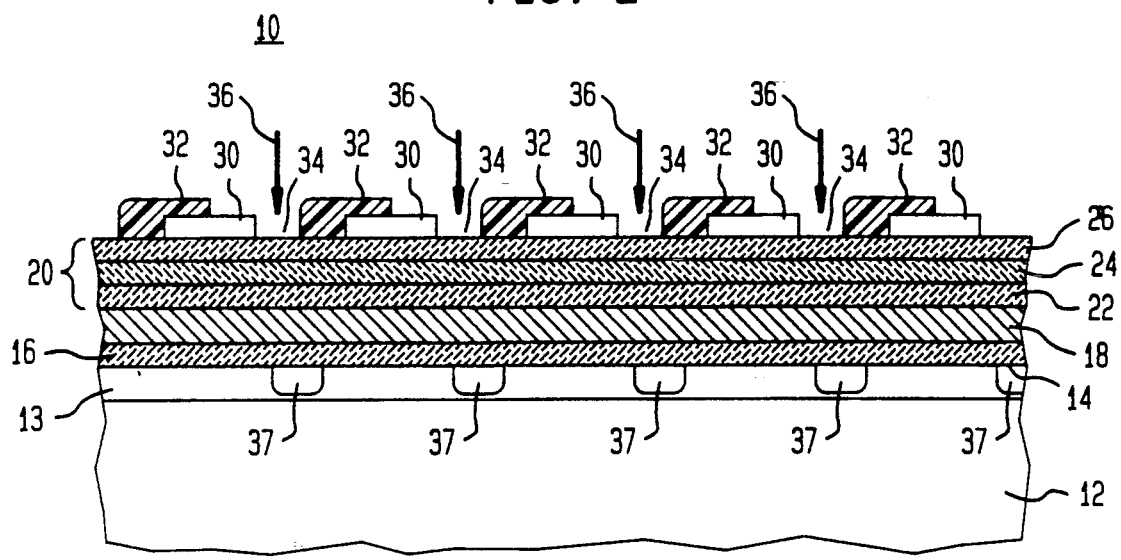

Referring now to FIG. 2, there is shown a sectional view of the CCD 10 in a next stage of fabrication in accordance with the method of the present invention. The second masking layer 28 is defined to form the second masking layer 28 into a plurality of spaced masking strips 30. This can be achieved by standard photolithographic and etching techniques. A third masking layer 32 of a photoresist is applied over the masking strips 30 and the surface of the third layer 26 in the spaces 34 between the masking strips 30. Using standard photolithography, the third masking layer 32 is defined to have individual portions which extend over a portion of each masking strip 30 and a portion of each of the spaces 34 between the masking strips 30. Each of the portions of the third masking layer 32 extends beyond the same end of its respective masking strip 30. As indicated by the arrows 36, impurities of the conductivity type opposite that of the channel region 13 are then implanted into the uncovered portions of the surface of the third layer 26 in the portions of the spaces 34 between each of the portions of the third masking layer 32 and its adjacent masking strip 30. If the channel region 13 is of n-type conductivity, the implanted impurities are of p-type conductivity, such as boron. The impurities are implanted through the third layer 26, the second layer 24, the first layer 22, the conductive layer 18 and the insulating layer 16 into the channel region 13 in the body 12. This forms barrier regions 37 along the channel region 13 which will be under the gate electrodes of the CCD 10.

Figure 3:
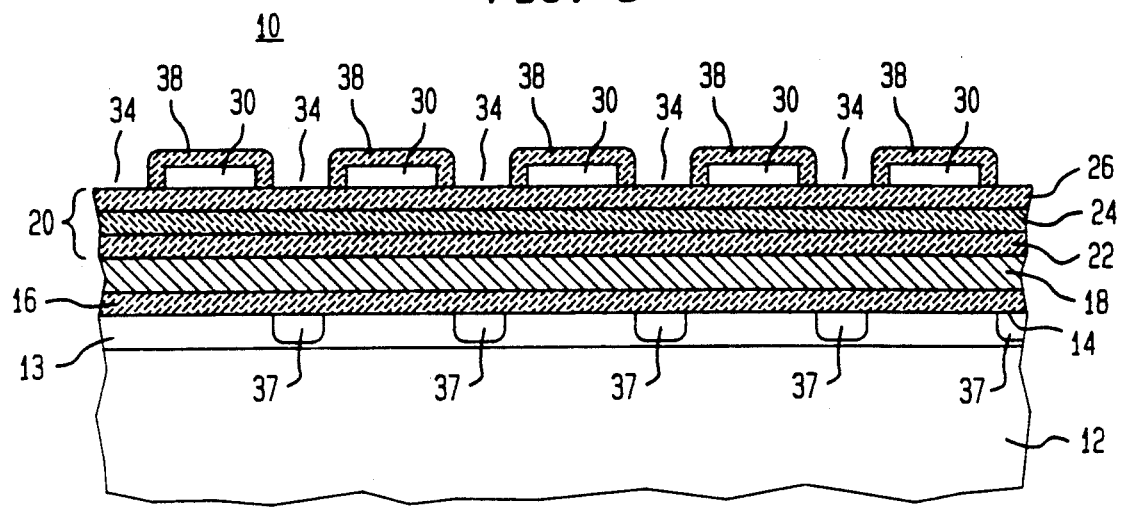

Referring now to FIG. 3, there is shown a sectional view of the CCD 10 during next stages of fabrication in accordance with the method of the present invention. After the impurities are implanted into the layer 13 to form regions 37, the third masking layer 32 is removed with a suitable solvent. A fourth masking layer 38 in the form of a layer of an oxide is then formed over each of the strips 30. For strips 30 of polycrystalline or amorphous silicon, which are preferred, the oxide layer 38 is of silicon dioxide. For a metal strip 30, the oxide is an oxide of the metal. The oxide layers 38 are formed by heating the CCD 10 in an oxidizing atmosphere to oxidize the surface of the strips 30. The thickness of the oxide layers 38, particularly at the ends of the strips 30, controls the spacing between the gate electrodes to be formed. Thus, the oxidation step is controlled to achieve an oxide layer 38 of the desired thickness. However, if the oxide layer 38 is grown too thick, its thickness can be reduced with a suitable etchant. As will be seen, this step of oxidizing the strips 30 is an important step for controlling the thickness of the spaces between the gate electrodes being formed.

Figure 4:
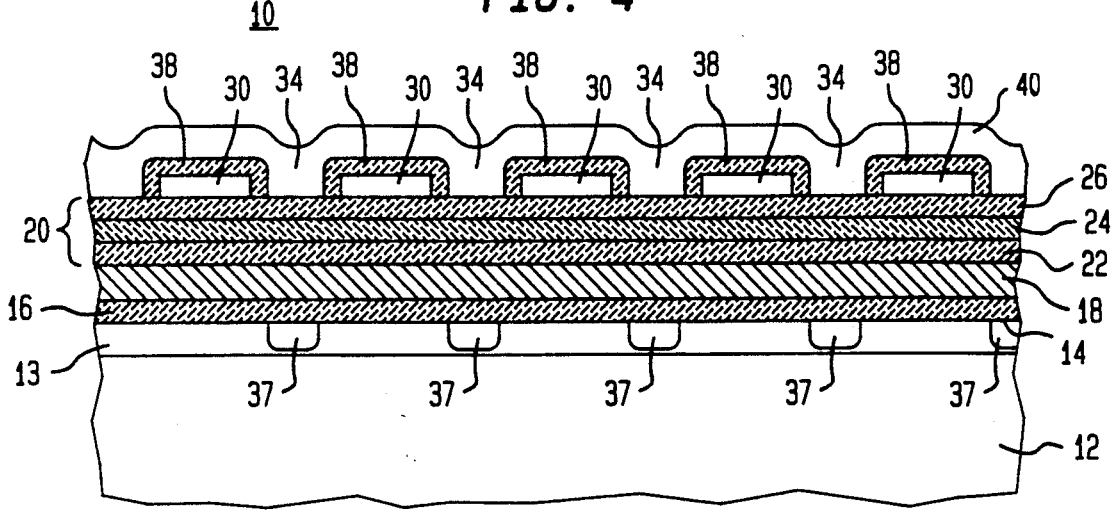

Referring now to FIG. 4, there is shown a sectional view of the CCD 10 during next stages of fabrication in accordance with the method of the present invention. A relatively thick layer 40 of a non-single crystalline silicon, such as polycrystalline or amorphous silicon, is then deposited over the oxide layers 38 and on the surface of the third layer 26 in the spaces 34 between the strips 30.

Figure 5:
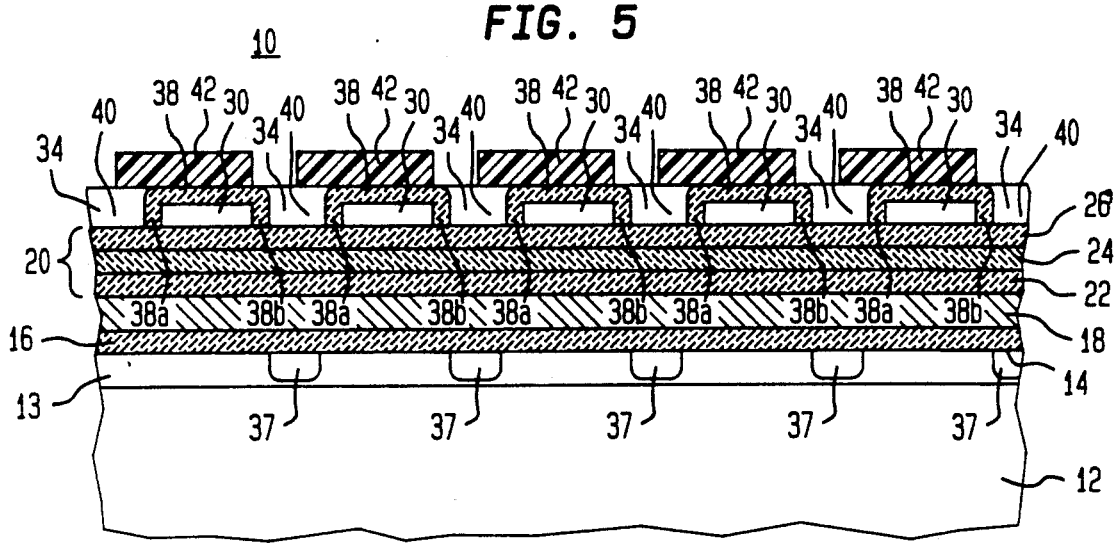

Referring now to FIG. 5, there is shown a sectional view of the CCD 10 during next stages in accordance with the method of the present invention. The polycrystalline or amorphous silicon layer 40 is planarized by etching with an anisotropic etch, such as a plasma etch or by ion milling. The etching is carried out until the oxide layers 38 are reached. The polycrystalline or amorphous silicon layer 40 only remains in the spaces 34 between the strips 30. An upper surface of the polycrystalline or amorphous silicon layer 40 is level with an upper surface of the oxide layers 38. A fifth masking layer 42 of a photoresist is then coated over the oxide layers 38 and the remaining portions of the polycrystalline or amorphous silicon layer 40. The fifth masking layer 42 is defined using standard photolithographic techniques to form spaced portions of the fifth masking layer 42, each of which extends across a portion of an oxide layer 38 and a portion of an adjacent portion of the polycrystalline or amorphous silicon layer 40. Each of the portions of the fifth masking layer 42 extends across a portion 38a of the oxide layer 38 between a strip 30 and an adjacent portion of the polycrystalline or amorphous silicon layer 40 at one end of the strip 30, the end of the strip 30 over the barrier region 37. However, a portion 38b of the silicon dioxide layer 38 at the other end of each strip 30 is exposed.

Figure 6:
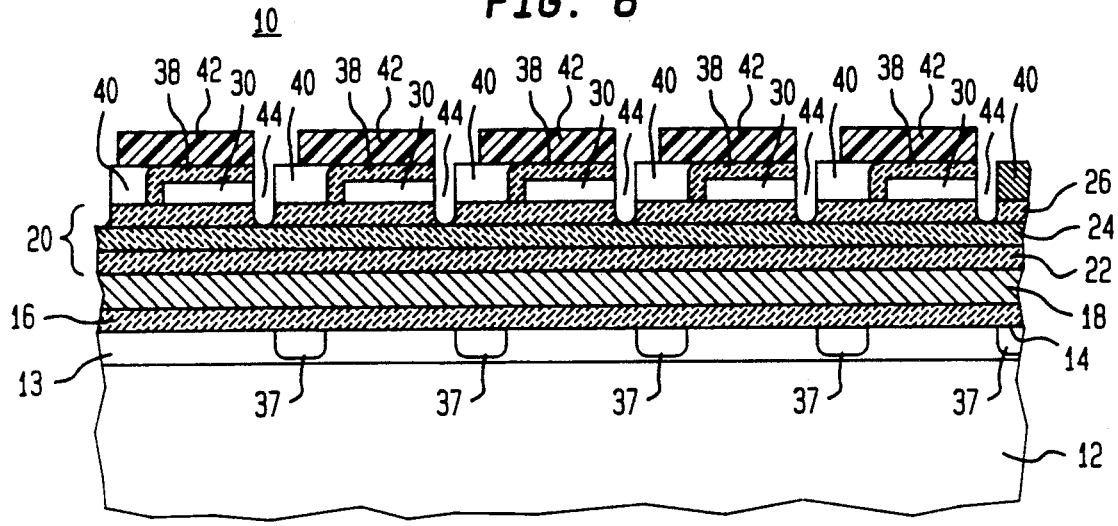

Referring now to FIG. 6, there is shown a sectional view of the CCD 10 during next stages of fabrication in accordance with the method of the present invention. The exposed portion 38b of each of the oxide layers 38 is then etched with a suitable etchant which will etch the oxide of the layers 38, but will not substantially etch polycrystalline or amorphous silicon. This exposes portions of the third layer 26, which is of silicon nitride. The exposed portions of the third layer 26 are then etched to form grooves 44 through the third layer 26 which are spaced along the third layer 26. A portion of the surface of the second layer 24 is exposed at the bottom of each of the grooves 44.

Figure 7:
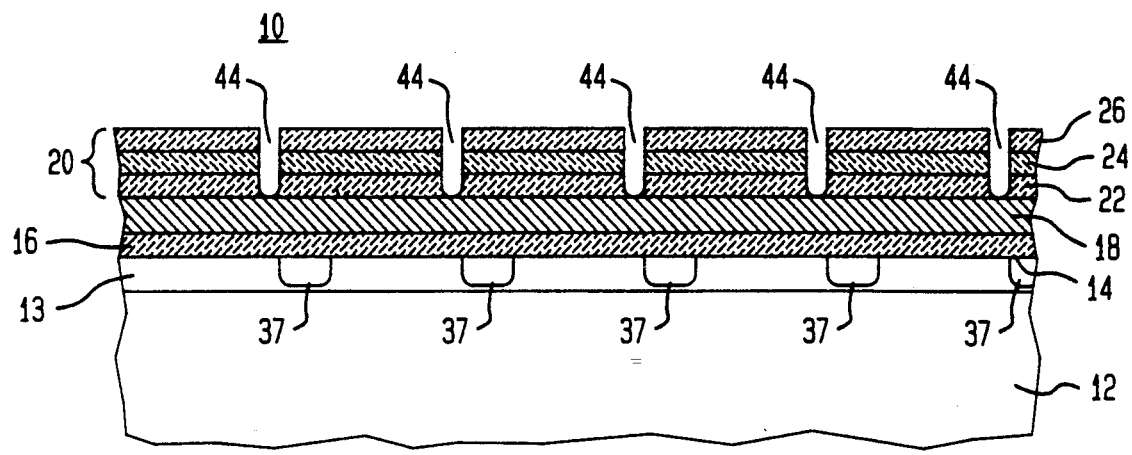

Referring now to FIG. 7, there is shown a sectional view of the CCD 10 during next stages of fabrication in accordance with the method of the present invention. The fifth masking layer 42 is removed using a suitable solvent. The remaining portions of the oxide fourth masking layers 38 are then removed using a suitable etchant, and the strips 30 are removed by using a suitable etchant. Using the third layer 26 as a mask, the grooves 44 are further extended so as to pass through the second layer 24 to the first layer 22 by using a suitable etchant which etches silicon dioxide but does not readily etch silicon nitride. The grooves 44 are then still further extended so as to pass through the first layer 22 to the conductive layer 18. This is achieved by using an etchant which etches silicon nitride but does not readily etch silicon dioxide. Although this may remove some or all of the silicon nitride third layer 26, the silicon dioxide second layer 24 acts as a mask for etching through the first layer 22.

Figure 8:
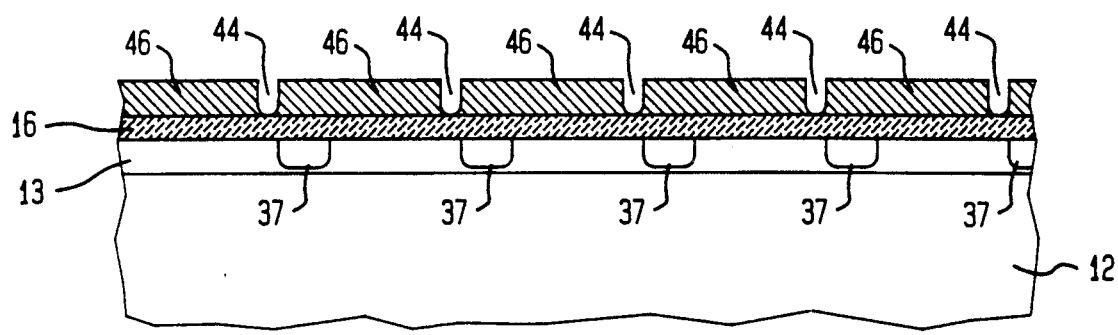

Referring now to FIG. 8, there is shown a sectional view of the CCD 10 after application of the method of the present invention. The grooves 44 are extended through the conductive layer 18 to divide the conductive layer 18 into individual gate electrodes 46. This is achieved with an etchant which etches polycrystalline silicon but does not readily etch silicon nitride. Thus, the silicon nitride first layer 22 acts as a mask for etching through the conductive layer 18. Instead of dividing the conductive layer 18 into the individual gate electrodes 46 by etching through the conductive layer 18, the portions of the conductive layer 18 at the bottom of the grooves 44 may be oxidized completely through the conductive layer 18. This can be achieved by heating the device in an oxidizing atmosphere. The oxide strips formed through the conductive layer 18 separate the layer 18 into the individual gate electrodes 46 which are electrically isolated from each other by the oxide strips.

Any of the silicon dioxide second layer 24 which remains is removed with a suitable etchant and the silicon nitride first layer 22 is removed with a suitable etchant. This leaves the gate electrodes 46 over the surface 14 of the body 12, and spaced along the channel region 13 by the grooves 44. Each of the gate electrodes 46 is positioned so that an edge thereof is over a barrier region 37 in the channel region 13. There is provided a narrow gap between the gate electrodes 46, the width of which is easily controlled by the thickness of the silicon dioxide fourth masking layer 38. The CCD is then completed in the usual manner. To form the two-phase CCD 10, alternate gate electrodes 46 are electrically connected to a first source of potential, and the other alternate gate electrodes 46 are connected to a second source of potential.

Thus, there is provided by the present invention a method of forming a two-phase CCD in which all of the gate electrodes 46 are formed from a single layer (level) of a conductive material. The gate electrodes 46 are spaced apart by a narrow gap which is of relatively uniform width since it is defined by the width of a thermally grown layer of silicon dioxide. Also, the method provides for a barrier region 37 in the channel region 13 under an edge of each of the gate electrodes 46 to achieve proper flow of charge carriers along the channel region 13 when the gate electrodes 46 are properly clocked by the sources of potential.

It is to be appreciated and understood that the specific embodiments of the invention are merely illustrative of the general principles of the invention. Various modifications may be made consistent with the principles set forth. For example, the materials used for the various masking layers may be changed as long as they will perform the function of the materials described.

What is claimed is:

1. A method of making a CCD comprising the steps of:
    forming a layer of a conductive material over and insulated from a surface of a body of a semiconductor material of one conductivity type;
    forming a first masking layer over the conductive layer;
    forming spaced strips of a material which can be oxidized and which can be etched by an etchant which does not effectively etch the material of the first masking layer on the surface of the first masking layer;
    forming a layer of an oxide over each of the strips with the oxide layer extending across the end edges of the strips so as to extend partially across the spaces between the strips;
    forming a layer of a non-single crystalline silicon on the surface of the first masking layer in the remaining portions of the spaces between the strips with the surface of the non-single crystalline silicon layer being substantially planar with the surface of the oxide layer over each of the strips;
    forming a second masking layer over each of the strips which extends over the portion of the oxide layer at one end of the strips leaving exposed the portion of the oxide layer at the other end of the strips;
    etching away the exposed portions of the oxide layers at the other end of each strip to expose a portion of the first masking layer thereunder;
    etching through the exposed portions of the first masking layer to the conductive material layer to form spaced grooves in the first masking layer which expose portions of the surface of the conductive layer; and then
    using the spaced grooves as a guide, dividing the conductive material layer into spaced gate electrodes.

2. The method of claim 1 in which the strips are of polycrystalline or amorphous silicon, and the oxide layer is of silicon dioxide.

3. The method of claim 2 further comprising forming a channel region of the conductivity type opposite that of the body in the body and along the surface thereof prior to forming the conductive material layer over the body.

4. The method of claim 3 in which the first masking layer comprises a first layer of silicon nitride directly on the conductive material layer, a second layer of silicon dioxide on the first layer, and a third layer of silicon nitride on the second layer.

5. The method of claim 4 further comprising forming barrier regions of the one conductivity type in the channel region beneath a portion of each of the spaces between the polycrystalline silicon strips.

6. The method of claim 5 in which the barrier regions of the one conductivity type are formed in the channel region by the steps of:
    prior to forming the silicon dioxide layer over the polycrystalline silicon strips forming a third masking layer over a portion of each of the strips and a portion of the surface of the first masking layer at one end of each strip; and
    embedding impurities of the one conductivity type through the first masking layer and into the channel region through the portions of the surface of the first masking layer not covered by the third masking layer.

7. The method of claim 6 further comprising removing the third masking layer prior to forming the silicon dioxide layer over the strips.

8. The method of claim 7 in which the silicon dioxide layer is formed over the strips by heating the strips in an atmosphere containing oxygen at a temperature at which the surface of the strips becomes silicon dioxide.

9. The method of claim 8 in which the polycrystalline or amorphous silicon layer is formed in the spaces between the strips by the steps of:
    depositing a layer of polycrystalline or amorphous silicon over the silicon dioxide layer over each of the strips and on the surface of the first masking layer between the strips; and
    etching away the polycrystalline or amorphous silicon layer over the strips leaving the polycrystalline or amorphous silicon layer only on the surface of the first masking layer between the strips.

10. The method of claim 9 in which the second masking layer extends over a portion of the polycrystalline or amorphous silicon layer between the strips adjacent the portion of the silicon dioxide layer at the other end of the strip as well as over the one portion of the silicon dioxide layer.

11. The method of claim 10 in which each of the layers of the first masking layer is removed when the grooves are etched through the next adjacent layer of the first masking layer.

12. The method of claim 11 in which the conductive material layer is divided into the gate electrodes by etching through the conductive material layer at the bottom of the grooves.

13. A method of making a CCD in a body of a semiconductor material of one conductivity type comprising the steps of:

forming in the body a channel region of a conductivity type opposite that of the body, the channel region extending to and along a surface of the body;

forming on the surface of the body and over the channel region a layer of an insulating material;

forming a layer of a conductive material on the insulating material layer;

forming a first masking layer on the conductive layer;

forming spaced strips of polycrystalline silicon on the first masking layer;

forming in the channel region a barrier region of the one conductivity type beneath a portion of each of the spaces between the strips of the polycrystalline silicon;

forming a layer of silicon dioxide on each of the strips, each of the silicon dioxide layers extending across the end edges of the strips so as to extend partially across the spaces between the strips;

forming a layer of polycrystalline silicon on the surface of the first masking layer in the remaining portions of the spaces between the strips with the surface of the polycrystalline silicon layer being substantially planar with the surface of the silicon dioxide layers on the strips;

forming a third masking layer over each of the strips which extends over a portion of the portion of the silicon dioxide layer only at one end of the strips leaving exposed the portion of the silicon dioxide layer at the other end of each strip;

etching away the exposed portion of the silicon dioxide layer at the other end of each of the strips to expose a portion of the first masking layer thereunder;

etching through the exposed portions of the first masking layer to the conductive material layer to form spaced grooves in the first masking layer which expose portions of the conductive material layer; and then etching through the exposed portions of the conductive material layer to define the conductive layer into spaced gate electrodes.

14. The method of claim 13 in which the first masking layer comprises a first layer of silicon nitride, a second layer of silicon dioxide and a third layer of silicon nitride.

15. The method of claim 14 in which the barrier regions of the one conductivity type are formed in the channel region by the steps of:

forming a third masking layer over a portion of each of the strips and a portion of the surface of the first masking layer at one end of the strip; and embedding impurities of the one conductivity type through the first masking layer, conductive material layer and insulating layer, and into the channel region through the portion of the surface of the first masking layer not covered by the third masking layer.

16. The method of claim 15 further comprising the step of removing the third masking layer prior to forming the silicon dioxide layer on the strips.

17. The method of claim 16 in which the polycrystalline silicon layer is formed in the spaces between the strips by the steps of:

depositing a layer of polycrystalline silicon on the silicon dioxide layers on the strips and on the surface of the first masking layer in the spaces between the strips; and etching away the polycrystalline silicon layer over the strips leaving the polycrystalline silicon layer only on the surface of the first masking layer between the strips.

18. The method of claim 17 in which the second masking layer extends over a portion of the polycrystalline silicon layer between the strips adjacent the portion of the silicon dioxide layer at the one end of the strips as well as over the one portion of the silicon dioxide layer.

19. The method of claim 18 in which each of the layers of the first masking layer is removed when the grooves are etched through the next adjacent layer of the first masking layer.

* * * * *